(12) United States Patent
Shin

(10) Patent No.: US 9,236,117 B2
(45) Date of Patent: Jan. 12, 2016

(54) SEMICONDUCTOR MEMORY DEVICE

(71) Applicant: SK hynix Inc., Gyeonggi-do (KR)

(72) Inventor: Wan Cheul Shin, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 78 days.

(21) Appl. No.: 14/184,189

(22) Filed: Feb. 19, 2014

(65) Prior Publication Data

US 2015/0091096 A1 Apr. 2, 2015

(30) Foreign Application Priority Data

Sep. 30, 2013 (KR) .......................... 10-2013-0116510

(51) Int. Cl.
*H01L 27/115* (2006.01)
*G11C 16/04* (2006.01)
*G11C 11/56* (2006.01)

(52) U.S. Cl.
CPC ........ *G11C 11/5621* (2013.01); *G11C 16/0408* (2013.01); *H01L 27/1157* (2013.01); *H01L 27/11582* (2013.01)

(58) Field of Classification Search
CPC ..................... H01L 27/1157; H01L 27/11578; H01L 27/1158; H01L 27/11582; G11C 16/0433; G11C 16/0466; G11C 16/0483
See application file for complete search history.

(56) References Cited

U.S. PATENT DOCUMENTS

| 8,274,108 | B2 * | 9/2012 | Katsumata et al. | ........... 257/319 |
| 8,441,855 | B2 * | 5/2013 | Liu | ........... 365/185.17 |
| 8,902,658 | B1 * | 12/2014 | Raghu et al. | ............. 365/185.13 |
| 8,987,089 | B1 * | 3/2015 | Pachamuthu et al. | ......... 438/268 |
| 8,987,908 | B2 * | 3/2015 | Lee et al. | ....... 257/758 |
| 9,006,817 | B2 * | 4/2015 | Choi | ............................. 257/324 |
| 2010/0232224 | A1 | 9/2010 | Maeda et al. | |
| 2012/0049267 | A1 * | 3/2012 | Jung | ............................. 257/324 |
| 2014/0359400 | A1 * | 12/2014 | Avila et al. | ..................... 714/773 |
| 2015/0124530 | A1 * | 5/2015 | Jung et al. | ................ 365/185.17 |

* cited by examiner

*Primary Examiner* — Allison P Bernstein
(74) *Attorney, Agent, or Firm* — IP & T Group LLP

(57) ABSTRACT

A semiconductor memory device includes a pipe channel layer formed on a semiconductor substrate, a first channel layer, a second channel layer and a third channel layer, connected with the pipe channel layer, first conductive layers stacked while surrounding the first channel layer, second conductive layers stacked while surrounding the second channel layer, and third conductive layers stacked while surrounding the third channel layer, wherein the first to third conductive layers are separately controlled.

19 Claims, 5 Drawing Sheets

SEMICONDUCTOR MEMORY DEVICE

CROSS-REFERENCE TO RELATED APPLICATION

The present application claims priority of Korean patent application number 10-2013-0116510, filed on Sep. 30, 2013, in the Korean Intellectual Property Office, the entire disclosure of which is incorporated herein by reference in its entirety.

BACKGROUND

1. Field of Invention

Various embodiments of the present invention relate to a semiconductor memory device, and more particularly, to a semiconductor memory device including a 3-dimensional (3D) structure.

2. Description of Related Art

As an industry in a field of a memory device, such as a nonvolatile memory device, has been highly developed, demands for high integration of the memory device have been increased. In the related art, integration of the memory device within a predetermined area is increased by a method of decreasing sizes of memory cells 2-dimensionally arranged on a semiconductor substrate. However, there is a physical limitation in decreasing the sizes of the memory cells. Accordingly, a method of highly integrating a memory device by 3-dimensionally arranging memory cells on a semiconductor substrate has been suggested. When the memory cells are 3-dimensionally arranged as described above, it is possible to efficiently utilize the area of the semiconductor substrate, and further improve a degree of integration compared to a case in which the memory cells are 2-dimensionally arranged. Particularly, when a 3D NAND flash memory device is implemented by 3-dimensionally arranging memory strings of the NAND flash memory device, which is advantageous to high integration, it is expected to maximize a degree of integration of the memory device, so that development of a 3D semiconductor memory device has been demanded.

FIG. 1 is a perspective view illustrating a structure of a 3D semiconductor memory device according to the related art. However, illustration of interlayer insulating layers is omitted for convenience of description.

As illustrated in FIG. 1A, a semiconductor device according to the related art includes U-shaped channel layers CH arranged in a first direction I-I' and a second direction II-II' crossing the first direction I-I'. Here, each of the U-shaped channel layers CH includes a pipe channel layer P_CH formed within a pipe gate layer PG, and a pair of source side channel layer S_CH and drain side channel layer D_CH connected with the pipe channel layer P_CH.

Further, the semiconductor memory device includes source side word line layers S_WL stacked along the source side channel layer S_CH on the pipe gate layer PG, and drain side word line layers D_WL stacked along the drain side channel layer D_CH on the pipe gate layer PG. Here, a source selection line layer SSL is stacked on the source side word lines S_WL, and a drain selection line layer DSL is stacked on the drain side word line layers D_WL.

According to the aforementioned structure, memory cells MC are stacked along the U-shaped channel layer CH, and a drain selection transistor DST and a source selection transistor SST are provided at both ends of the U-shaped channel layer CH, respectively. Accordingly, strings are arranged in a U-shape.

Further, the semiconductor memory device includes bit line layers BL connected with the drain side channel layer D_CH, to be extended in the first direction I-I', and a source line layer SL connected with the source side channel layer S_CH, to be extended in the second direction II-II'.

BRIEF SUMMARY

The present invention has been made in an effort to provide a semiconductor memory device, and particularly, a semiconductor memory device having a 3D structure capable of decreasing a disturbance phenomenon during a program operation.

An exemplary embodiment of the present invention provides a semiconductor memory device, including a pipe channel layer formed on a semiconductor substrate, a first channel layer, a second channel layer and a third channel layer, connected with the pipe channel layer, first conductive layers stacked while surrounding the first channel layer, second conductive layers stacked while surrounding the second channel layer, and third conductive layers stacked while surrounding the third channel layer, wherein the first to third conductive layers are separately controlled.

Another exemplary embodiment of the present invention provides a semiconductor memory device, including a pipe channel layer formed on a semiconductor substrate, a first drain side channel layer connecting the pipe channel layer and a bit line layer, a second drain side channel layer connecting the pipe channel layer and the bit line layer, and a source side channel layer connecting the pipe channel layer and a source line layer, and disposed between the first drain side channel layer and the second drain side channel layer.

Yet another exemplary embodiment of the present invention provides a semiconductor memory device, including a source side channel layer including a source selection transistor, source side memory cells, and a source side selection transistor, which are serially connected between a source line layer and a common node, a first drain side channel layer including a first drain selection transistor, first drain side memory cells, and a first drain side selection transistor, which are serially connected between a bit line layer and the common node, and a second drain side channel layer including a second drain selection transistor, second drain side memory cells, and a second drain side selection transistor, which are serially connected between the bit line layer and the common node, wherein the first drain side channel and the second drain side channel layer are connected in parallel between the bit line layer and the common node.

According to the embodiment of the present invention, it is possible to prevent a program disturbance phenomenon of the source side memory cells of other strings during a program operation of the source side memory cells by forming a channel structure in which the source side memory cells are disposed between the drain side memory cells.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present invention will become more apparent to those of ordinary skill in the art by describing in detail embodiments thereof with reference to the attached drawings in which.

DETAILED DESCRIPTION

Figure 1:
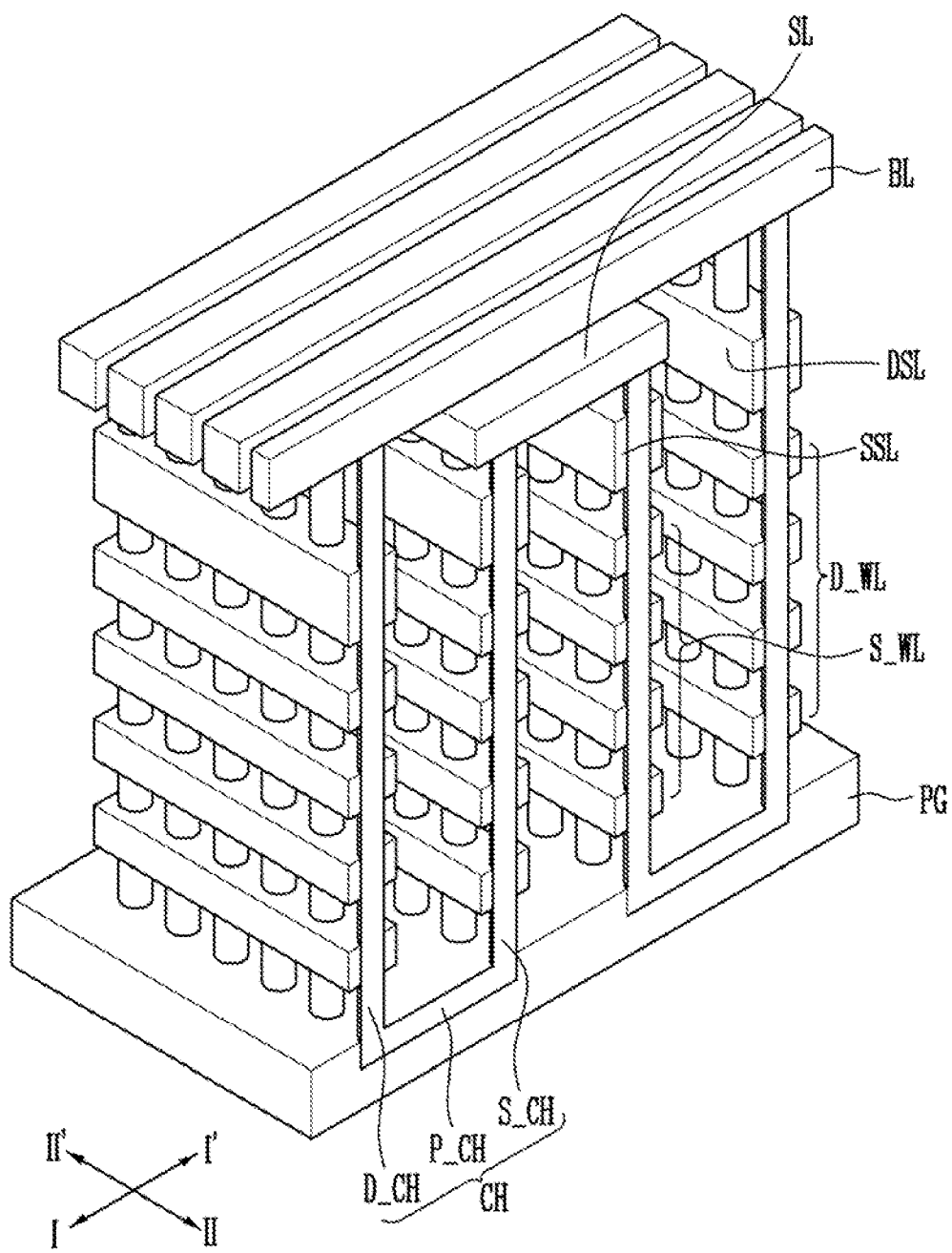
FIG. 1 is a perspective view illustrating a structure of a semiconductor memory device according to the related art.

Hereinafter, an embodiment of the present invention will be described with reference to the accompanying drawings in detail. However, the present invention is not limited to an embodiment disclosed below and may be implemented in various forms and the scope of the present invention is not limited to the following embodiments. Rather, the embodiment is provided to more sincerely and fully disclose the present invention and to completely transfer the spirit of the present invention to those skilled in the art to which the present invention pertains, and the scope of the present invention should be understood by the claims of the present invention.

In the drawings, the thicknesses and the intervals of elements are exaggerated for convenience of illustration, and may be exaggerated compared to an actual physical thickness. It should be readily understood that the meaning of "on" in the present disclosure should be interpreted in the broadest manner such that "on" means not only "directly on" but also "on" something with an intermediate feature(s) or a layer(s) therebetween. In describing the present invention, a publicly known configuration Irrelevant to the principal point of the present invention may be omitted. It should note that in giving reference numerals to elements of each drawing, like reference numerals refer to like elements even though like elements are shown in different drawings. It is also noted that in this specification, "connected" refers to one component not only directly connecting another component but also indirectly connecting another component through an intermediate component. In addition, a singular form may include a plural form as long as it is not specifically mentioned in a sentence.

Figure 2:
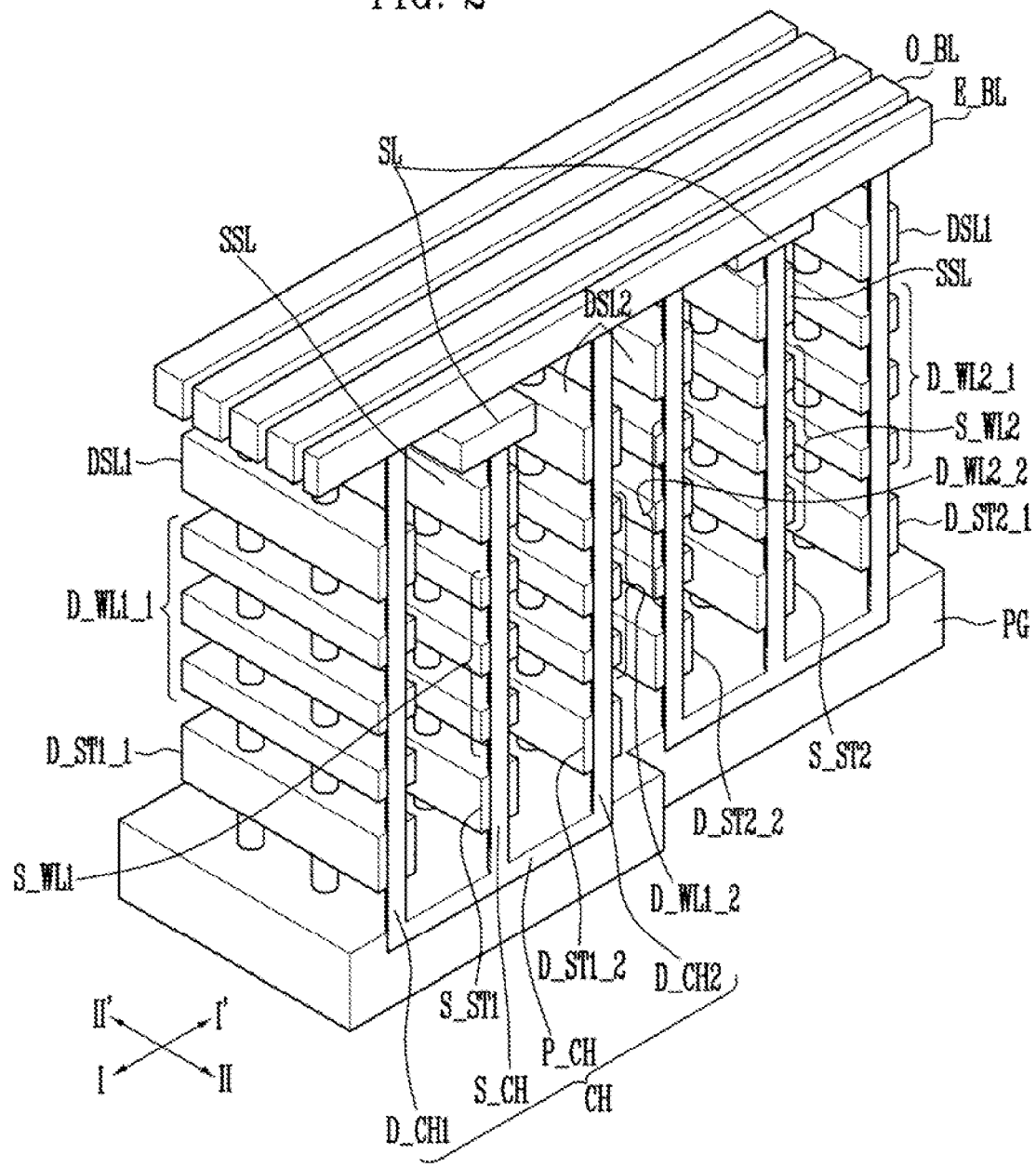
FIG. 2 is a perspective view illustrating a structure of a semiconductor memory device according to an embodiment of the present invention.

FIG. 2 is a perspective view illustrating a structure of a semiconductor memory device according to an embodiment of the present invention. However, illustration of interlayer insulating layers is omitted for convenience of description.

As illustrated in FIG. 2, a semiconductor memory device according to an embodiment of the present invention includes channel layers CH each including a pipe channel layer P_CH, and a pair of first and second drain side channel layers D_CH1 and D_CH2 and a source side channel layer S-CH that are connected with the pipe channel layer P_CH, a source selection line layer SSL formed of at least one layer, stacked while surrounding the source side channel layer S_CH, first and second drain selection line layers DSL1 and DSL2, each formed of at least one layer, stacked while surrounding the first and second drain side channel layers D_CH1 and D_CH2, respectively, adjacent to an even bit line layer E_BL and an odd bit line layer O_BL, first and second drain side selection transistor line layers D_ST1_1 and D_ST1_2, each formed of at least one layer, stacked while surrounding the first and second drain side channel layers D_CH1 and D_CH2, respectively, adjacent to the pipe channel layer P_CH, and a source side selection transistor line layer S_ST1 formed of at least one layer, stacked while surrounding the source side channel layer S_CH, adjacent to the pipe channel layer P_CH.

The channel layers CH are arranged in a first direction I-I' and a second direction II-II' crossing the first direction I-I'. Here, the channel layers CH adjacent in the first direction I-I' are arranged so that center regions are inconsistent with each other in the second direction II-II'. The channel layers CH adjacent in the first direction I-I' may be inconsistently arranged in the unit of one channel layer or in the unit of a plurality of channel layers. In this case, string columns may be bent in a zigzag form to be extended in the first direction I-I'. Further, one string column is connected with two or more bit line layers O_BL and E_BL.

First and second drain side word lines _WL1_1 and D_WL1_2, each formed of multiple layers, are stacked between the pipe gate layer PG and the first drain selection line layer DSL1 and between the pipe gate layer PG and the second drain selection line layer and DSL2, respectively. Further, source side word lines S_WL1 formed of multiple layers, are stacked between the pipe gate layer PG and the source selection line layer SSL, and the source side word lines S_WL1 are disposed between the first and second drain side world lines D_WL1_1 and D_WL1_2.

Further, the semiconductor memory device further includes a source line layer SL formed above the source selection line layer SSL, and bit line layers O_BL, E_BL extended in parallel in the first direction I-I'. Here, odd bit line layers O_BL are connected with the drain side channel layers D_CH of odd-numbered channel layers CH, and even bit line layers E_BL are connected with the drain side channel layers D_CH of even-numbered channel layers CH.

According to the aforementioned structure, the memory cells are stacked along the channel layer CH. The first drain selection transistor, the second drain selection transistor and the source selection transistor are provided at portions at which the channel layer CH is connected with the first drain selection line layer DSL1, the second drain selection line layer DSL2 and the source selection line layer SSL, respectively. The first drain side selection transistor, the second drain side selection transistor and the source side selection transistor are provided at portions at which the channel layer CH is connected with the first drain side selection transistor line layer D_ST1_1, the second drain side selection transistor line layer D_ST1_2 and the source side selection transistor line layer S_ST1, respectively. Gates of the first and second drain selection transistors and the source selection transistor are separated from each other to be controlled, and gates of the first and second drain side selection transistors and the source side selection transistor are separated from each other to be controlled.

In the meantime, a method of manufacturing the semiconductor memory device according to the exemplary embodiment of the present invention will be described below.

First, trenches arranged in the first direction I-I' and the second direction II-II' are formed by etching a pipe gate layer PG, and trench columns extended in the first direction I-I' are formed to be arranged in a zigzag form. Next, a sacrificial layer is buried within the trenches, and then a capping layer is formed on the pipe gate layer PG in which the sacrificial layer is buried. Here, the capping layer may be formed of the same material as that of the pipe gate layer PG. The capping layer may be used as an etching stopping layer during a subsequent process of forming a slit, and may also be used as a pipe gate during the driving of the memory device.

Next, first material layers and second material layers are alternately formed on the capping layer. Here, the first material layers are used for forming word lines and selection lines, and the second material layers are used for forming interlayer insulating layers for insulating the stacked word lines and selection lines.

For example, the first material layer is formed of a conductive layer, such as a polysilicon layer, and the second material layer may be formed of an insulating layer, such as an oxide layer. For another example, the first material layer may be formed of a conductive layer, such as a doped polysilicon layer and a doped amorphous silicon layer, and the second material layer 34 may be formed of a sacrificial layer, such as an undoped polysilicon layer and an undoped amorphous silicon layer. For still another example, the first material layer may be formed of a sacrificial layer, such as a nitride layer, and the second material layer may be formed of an insulating layer, such as an oxide layer.

Next, for example, a channel layer connected with a trench of the pipe gate layer PG is formed by etching the first material layers and the second material layers. In this case, channel holes may be formed so that three channel holes are connected to the trench.

Next, after the sacrificial layer at lower surfaces of the channel holes, in the trench, are removed, a memory layer is formed along the trench and internal surfaces of the three channel holes. Here, the memory layer includes a charge blocking layer, a charge trap layer, and a tunnel insulating layer.

Next, a semiconductor layer is formed on the memory layer to form a channel layer CH. Here, the channel layer CH includes a source side channel layer S_CH connected with a pipe channel layer P_CH formed within the trench of the pipe gate layer PG, and first and second drain side channel layers D_CH1 and D_CH2 disposed at both sides of the source side channel layer S_CH to be connected with the pipe channel layer P_CH. That is, the channel layer CH includes the pipe channel layer P_CH horizontally disposed to the pipe gate layer PG, the first and second drain side channel layers D_CH1 and D_CH2 vertically connected to both ends of the pipe channel layer P_CH, and the source side channel layer S_CH vertically connected to the center of the pipe channel layer P_CH. The aforementioned process for fabricating a channel layer is repetitively performed, so a plurality of channel layers CH are formed.

Next, first slits are formed by etching the first material layers and the second material layers between the source side channel layers S_CH and the first and second drain side channel layers D_CH1 and D_CH2.

In this case, second slits are additionally formed even between the drain side channel layers D_CH in order to prevent the strings positioned at an edge of the memory block from sharing strings positioned at an edge of an adjacent memory block and the first and second drain selection line layers DSL1 and DSL2.

Accordingly, the first and second drain selection line layers DSL1 and DSL2, source selection lines SSL, first drain side word lines D_WL1_1 and D_WL2_1, second drain side word lines D_WL1_2 and D_WL2_2, and source side word lines S_WL1 and S_WL2 are formed.

Next, an insulating layer is buried in the first and second slits. In this case, an additional process may be performed prior to burying the insulating layer in the first and second slits, depending on material characteristics of the first material layers and the second material layers.

For example, when the first material layer is formed of a conductive layer and the second material layer is formed of an insulating layer, the first material layers exposed by the first and second slits are silicided, and then an insulating layer is buried in the first and second slits. Accordingly, a manufacturing process of the memory cell is completed.

For another example, when the first material layer is formed of a conductive layer, and the second material layer is formed of a sacrificial layer, the second material layers exposed in the first and second slits are removed. Next, an insulating layer is buried in the regions in which the second material layers are removed, and is buried in the first and second slits. Accordingly, the manufacturing process of the memory cell is completed.

For still another example, when the first material layer is formed of a sacrificial layer and the second material layer is formed of an insulating layer, the first material layers exposed within the slits are removed. Next, a charge blocking layer formed of an aluminum oxide layer ($Al_2O_3$) or a charge blocking layer in which an oxide layer and the aluminum oxide layer ($Al_2O_3$) are stacked is additionally formed within the regions in which the first material layers are removed, and then a conductive layer formed of tungsten and the like is buried to form the word line, the selection line, and the like. In this case, prior to additionally forming the charge blocking layer, the charge blocking layer within the damaged channel holes may be removed in the process of removing the first material layers. Next, an insulating layer is buried in the first and second slits. Accordingly, the manufacturing process of the memory cell is completed.

Next, source contact plugs connected with the source side channel layers S_CH are formed, and then source line layers SL are formed in parallel to the second direction II-II'. Further, drain contact plugs connected with the drain side channel layers D_CH are formed, and then bit line layers O_BL and E_BL extended in parallel to the first direction I-I' are formed.

Figure 3:
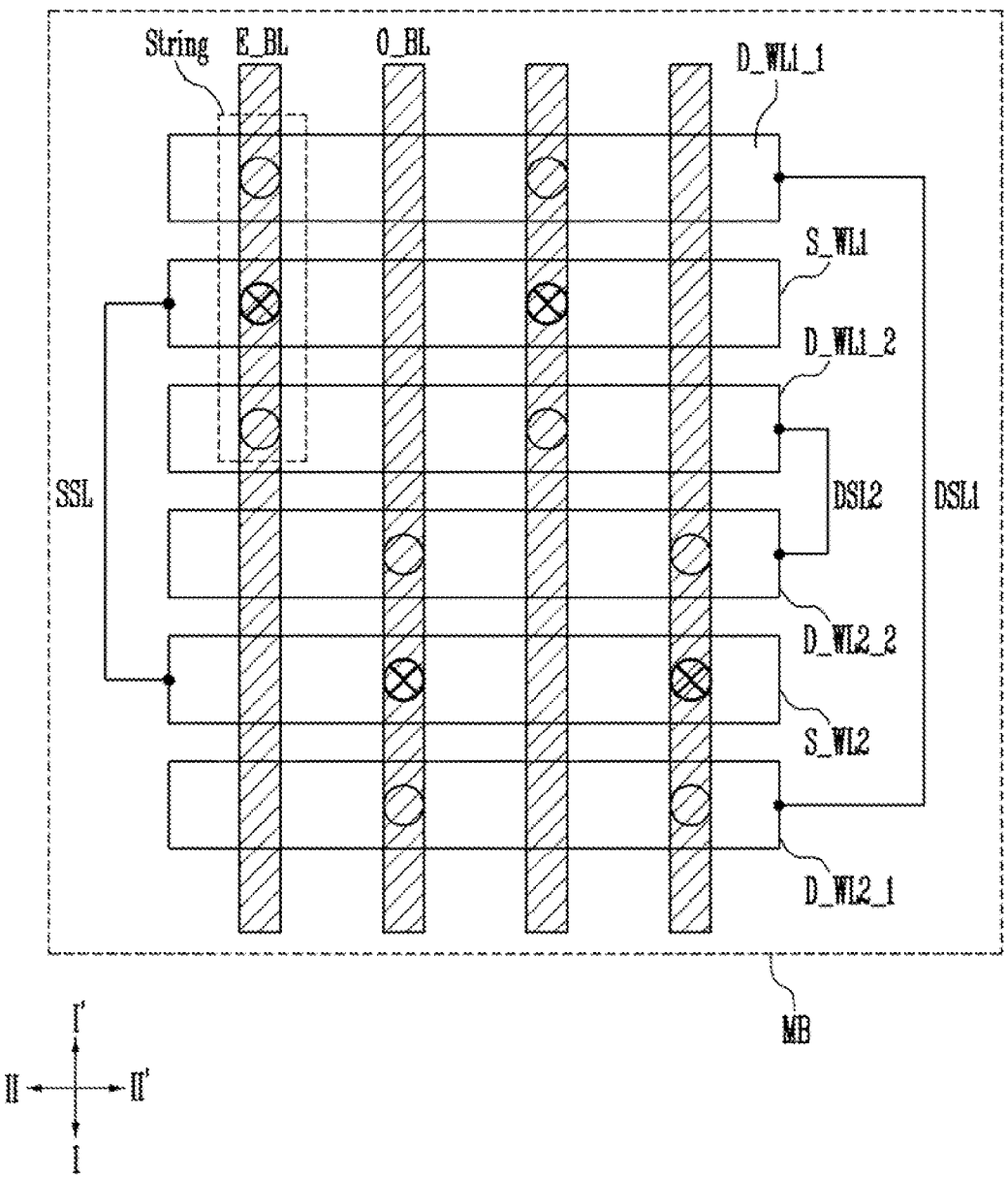
FIG. 3 is a layout diagram illustrating the structure of the semiconductor memory device of FIG. 2 according to an embodiment of the present invention.
Figure 4:
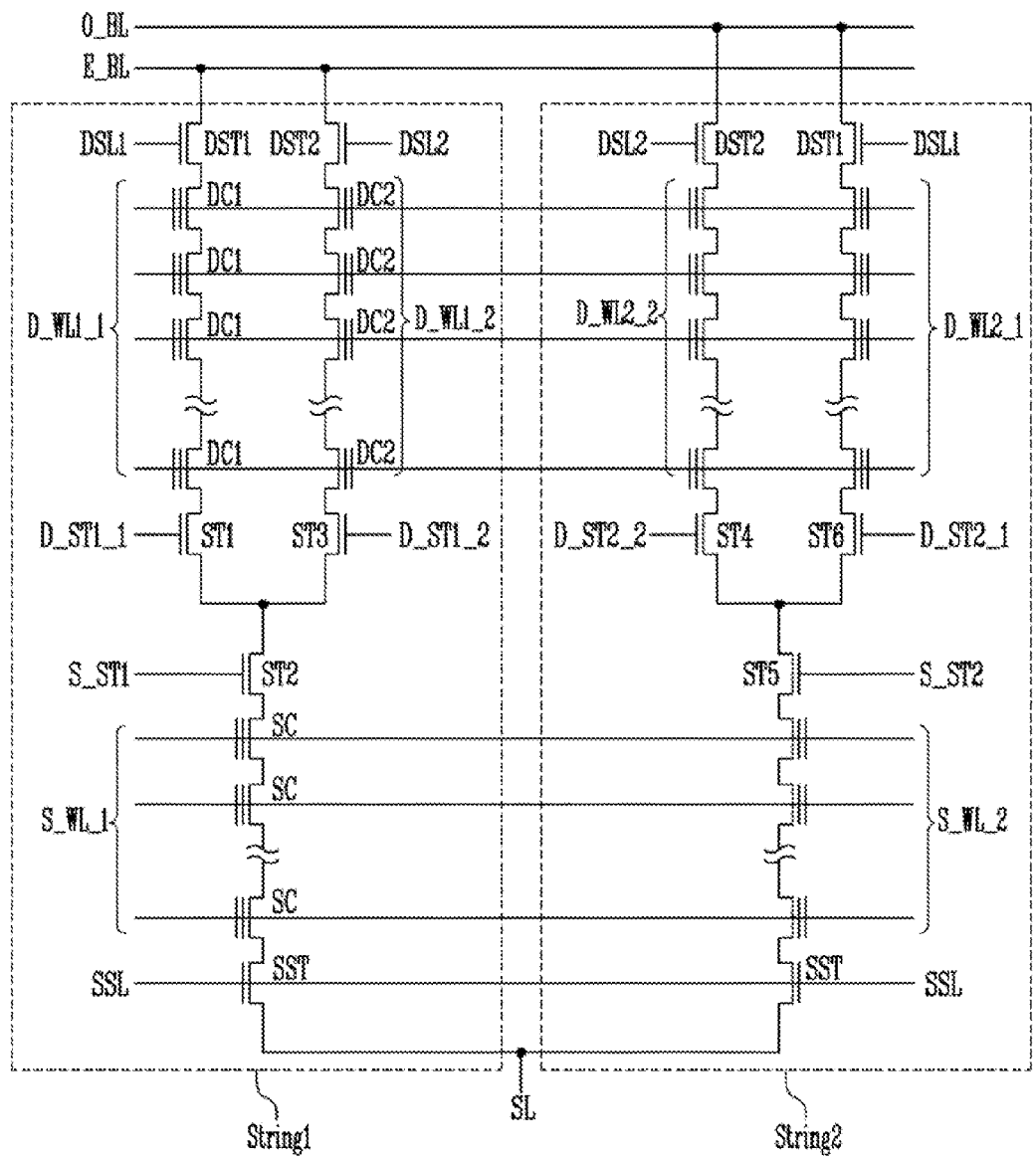
FIG. 4 is a circuit diagram of the structure of the semiconductor memory device of FIG. 2 according to an embodiment of the present invention.

FIGS. 3 and 4 are diagrams illustrating the structure of the semiconductor memory device of FIG. 2 according to the exemplary embodiments of the present invention. FIG. 3 is a layout diagram of a cell array, and FIG. 4 is a circuit diagram illustrating a part of the cell array.

As illustrated in FIG. 3, in the semiconductor memory device according to an embodiment of the present invention, one memory block MB includes a plurality of strings. Each of the strings includes the first drain side word line D_WL1_1, the second drain side word line D_WL1_2 and the source side word line S_WL1, or the first drain side word line D_WL2_1, the second drain side word line D_WL2_2 and the source side word line S_WL2.

As illustrated in FIG. 4, the semiconductor memory device according to an embodiment of the present invention includes a plurality of strings String1 and String2, and the respective strings have the similar structures to each other. In this case, the first string String1 is connected to the even bit line layer E_BL, and the second string String2 is connected to the odd bit line layer O_BL.

The first string String1 includes a first drain side channel layer, a second drain side channel layer, and a source side channel layer. The first drain side channel layer includes a drain side selection transistor ST1, a drain selection transistor DST1 connected with the even bit line layer E_BL, and a plurality of first drain side memory cells DC1 connected between the drain side selection transistor ST1 and the drain selection transistor DST1.

The second drain side channel layer includes a drain side selection transistor ST3, a drain selection transistor DST2 connected with the even bit line layer E_BL, and a plurality of second drain side memory cells DC2 connected between the drain side selection transistor ST3 and the drain selection transistor DST2.

The source side channel layer includes a source side selection transistor ST2, a source selection transistor SST connected with the source line layer SL, and a plurality of source side memory cells SC connected between the source side selection transistor ST2 and the source selection transistor SST.

An operation of the semiconductor memory device according to the present invention will be described below with reference to FIGS. 2 to 4.

First, a program operation of the semiconductor memory device according to the present invention will be described below.

1) Program Operation of Source Side Memory Cells

When a program target cell is the source side memory cell SC of the first string String1, an operation voltage VSSL is applied to the source selection line layer SSL connected with the source selection transistor SST, and a power voltage Vcc is applied to any one of the first and second drain selection line layers DSL1 and DSL2 connected with the first and second drain selection transistors DST1 and DST2. For example, the power voltage Vcc is applied to the first drain selection line layer DSL1, and a ground voltage GND is applied to the second drain selection line layer DSL2. Further, the power voltage Vcc is applied to the first drain side selection transistor line layer D_ST1_1 and the source side selection transistor line layer S_ST1 so that the first drain side selection transistor ST1 and the source side selection transistor ST2 are turned on for the connection with the source side channel layer S_CH and the first drain side channel layer D_CH1. Accordingly, the source side memory cell SC is connected to the even bit line layer E_BL in which the program operation is selected through the source side channel layer S_CH, the pipe channel layer P_CH, and the first drain side channel layer D_CH1. Then, a program voltage is applied to the word line connected with the selected memory cell, and a pass voltage is applied to the remaining word lines to perform the program operation.

2) Program Operation of Drain Side Memory Cells

When the program target cell is the first drain side memory cell DC1 of the first string String1, the operation voltage VSSL is applied to the source selection line layer SSL connected with the source selection transistor SST, and the power voltage Vcc is applied to the first drain selection line layer DSL1 connected with the first drain selection transistor DST1. In this case, the ground voltage GND is applied to the second drain selection line layer DSL2 connected with the second drain selection transistor DST2. Further, the power voltage Vcc is applied to the first drain side selection transistor line layer D_ST1_1 and the source side selection transistor line layer S_ST1 so that the first drain side selection transistor ST1 and the source side selection transistor ST2 are turned on for the connection with the source side channel layer S_CH and the first drain side channel layer D_CH1. Accordingly, the first drain side memory cell DC1 is connected to the even bit line layer E_BL in which the program operation is selected through the source side channel layer S_CH, the pipe channel layer P_CH, and the first drain side channel layer D_CH1. Then, a program voltage is applied to the word line connected with the selected memory cell, and a pass voltage is applied to the remaining word lines to perform the program operation.

When the program target cell is the second drain side memory cell DC2 of the first string String1, the operation voltage VSSL is applied to the source selection line layer SSL connected with the source selection transistor SST, and the power voltage Vcc is applied to the second drain selection line layer DSL2 connected with the second drain selection transistor DST2. In this case, the ground voltage GND is applied to the first drain selection line layer DSL1 connected with the first drain selection transistor DST1. Further, the power voltage Vcc is applied to the second drain side selection transistor line layer D_ST1_2 and the source side selection transistor line layer S_ST1 so that the second drain side selection transistor ST3 and the source side selection transistor ST2 are turned on for the connection with the source side channel layer S_CH and the second drain side channel layer D_CH2. Accordingly, the second drain side memory cell DC2 is connected to the even bit line layer E_BL in which the program operation is selected through the source side channel layer S_CH, the pipe channel layer P_CH, and the second drain side channel layer D_CH2. Then, a program voltage is applied to the word line connected with the selected memory cell, and a pass voltage is applied to the remaining word lines to perform the program operation.

As described above, in the semiconductor memory device according to the present invention, the drain side memory cells are disposed at both sides of one source side memory cell, so that a program disturbance phenomenon of a source side memory cell of another string is prevented during the program operation of the source side memory cell.

A read operation of the semiconductor memory device according to the present invention will be described below.

1) Read Operation of Source Side Memory Cells

When the read target cell is the source side memory cell SC of the first string String1, the operation voltage VSSL is applied to the source selection line SSL connected with the source selection transistor SST, and the power voltage Vcc is applied to any one of the first and second drain selection line layers DSL1 and DSL2 connected with the first and second drain selection transistors DST1 and DST2. For example, the power voltage Vcc is applied to the first drain selection line layer DSL1, and the ground voltage GND is applied to the second drain selection line layer DSL2. Further, the power voltage Vcc is applied to the first drain side selection transistor line layer D_ST1_1 and the source side selection transistor line layer S_ST1 so that the first drain side selection transistor ST1 and the source side selection transistor ST2 are turned on for the connection with the source side channel layer S_CH and the first drain side channel layer D_CH1. Accordingly, the source side memory cell SC is connected to the even bit line layer E_BL in which the read operation is selected through the source side channel layer S_CH, the pipe channel layer P_CH, and the first drain side channel layer D_CH1. Then, a read voltage is applied to the word line connected with the selected memory cell, and the pass voltage is applied to the remaining word lines to perform the program operation.

2) Read Operation of Drain Side Memory Cells

When the read target cell is the first drain side memory cell DC1 of the first string String1, the operation voltage VSSL is applied to the source selection line layer SSL connected with the source selection transistor SST, and the power voltage Vcc is applied to the first drain selection line layer DSL1 connected with the first drain selection transistor DST1. In this case, the ground voltage GND is applied to the second drain selection line layer DSL2 connected with the second drain selection transistor DST2. Further, the power voltage Vcc is applied to the first drain side selection transistor line layer D_ST1_1 and the source side selection transistor line layer S_ST1 so that the first drain side selection transistor ST1 and the source side selection transistor ST2 are turned on for the connection with the source side channel layer S_CH and the first drain side channel layer D_CH1. Accordingly, the first drain side memory cell DC1 is connected to the even bit line layer E_BL in which the read operation is selected through the source side channel layer S_CH, the pipe channel layer P_CH, and the first drain side channel layer D_CH1. Then, the read voltage is applied to the word line connected with the selected memory cell, and the pass voltage is applied to the remaining word lines to perform the read operation.

As described above, the semiconductor memory device including the channel, in which the first and second drain side memory cells and the source side memory cells are included in one string, includes the drain side transistors, to perform the program operation and the read operation by selecting one channel among the channels to which the first and second drain side memory cells are connected.

Figure 5:
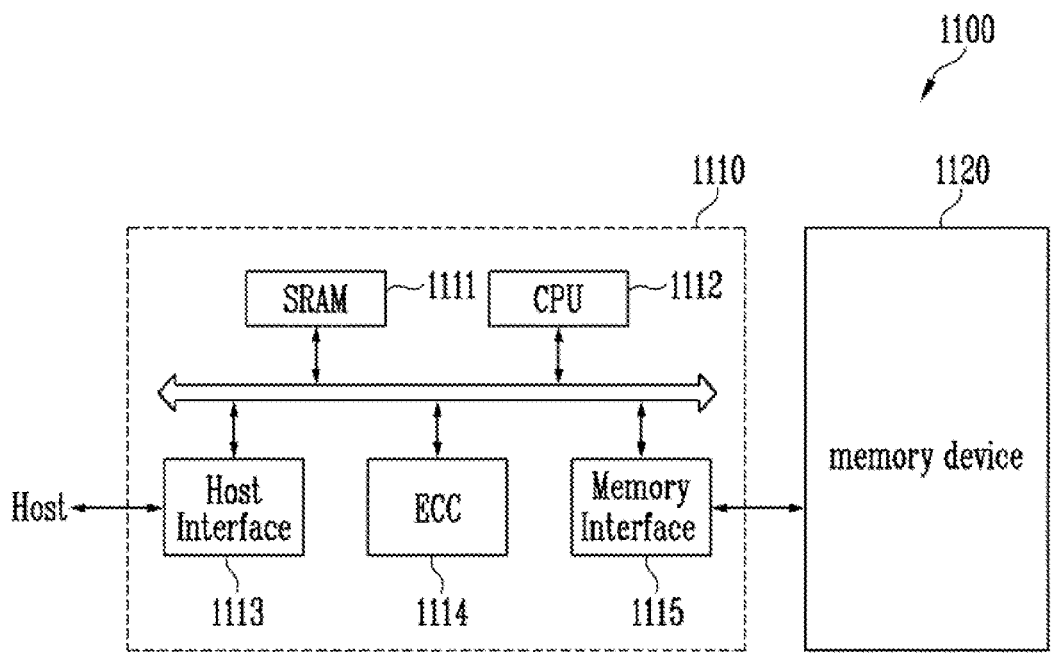
FIG. 5 is a configuration diagram illustrating a memory system according to an embodiment of the present invention.

FIG. 5 is a configuration diagram illustrating a memory system according to an embodiment of the present invention.

Referring to FIG. 5, a memory system 1100 according to an embodiment of the present invention includes a nonvolatile memory device 1120 and a memory controller 1110.

The nonvolatile memory device 1120 includes the semiconductor memory device described with reference to FIGS. 2 to 4. That is, the nonvolatile memory device 1120 may be formed of a semiconductor memory device including a channel layer structure including first and second drain side channel layers and a source side channel layer. Further, the nonvolatile memory device 1120 may be a multi-chip package formed of a plurality of flash memory chips.

The memory controller 1110 may control the non-volatile memory device 1120, and may include an SRAM 1111, a CPU 1112, a host interface 1113, an ECC 1114, and a memory interface 1115. The SRAM 1111 is used as an operational memory of a CPU 1112, the CPU 1112 performs a general control operation for a data exchange of the memory controller 1110, and a host interface 1113 includes a data exchange protocol of a host connected with the memory system 1100. Further, the ECC 1114 detects and corrects an error included in data read from the non-volatile memory device 1120, and the memory interface 1115 performs interfacing with the non-volatile memory device 1120. In addition, the memory controller 1110 may further include an ROM for storing code data for the interfacing with the host.

As described above, the memory system 1100 including the aforementioned structure may be a memory card or a Solid State Disk (SSD) in which the nonvolatile memory device 1120 is combined with the memory controller 1110. For example, when the memory system 1100 is the SSD, the memory controller 1110 may communicate with an external device (for example, a host) through one of various interface protocols, such as USB, MMC, PCI-E, SATA, PATA, SCSI, ESDI, and IDE.

Figure 6:
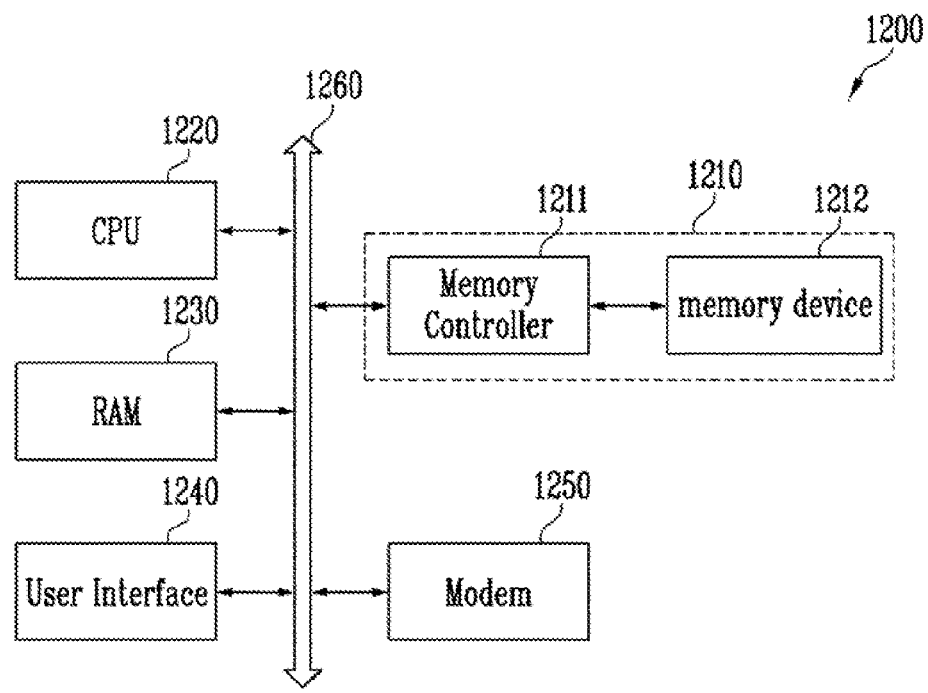
FIG. 6 is a configuration diagram illustrating a computing system according to an embodiment of the present invention.

FIG. 6 is a diagram illustrating a computing system according to an embodiment of the present invention.

Referring to FIG. 6, a computing system 1200 according to an embodiment of the present invention may include a CPU 1220, a RAM 1230, a user interface 1240, a modem 1250, and a memory system 1210, which are electrically connected to a system bus 1260. Further, when the computing system 1200 is a mobile device, the computing system 1200 may further include a battery for supplying an operational voltage to the computing system 1200, and may further include an application chip-set, a CMOS image sensor CIS, a mobile DRAM, and the like.

The memory system 1210 may be formed of a nonvolatile memory 1212 and a memory controller 1211 as previously described with reference to FIG. 5.

The technical spirit of the present disclosure have been described according to the exemplary embodiment in detail, but the exemplary embodiment has described herein for purposes of Illustration and does not limit the present disclosure. Further, those skilled in the art will appreciate that various modifications may be made without departing from the scope and spirit of the present disclosure.

As described above, the embodiment has been disclosed in the drawings and the specification. The specific terms used herein are for purposes of illustration, and do not limit the scope of the present invention defined in the claims. Accordingly, those skilled in the art will appreciate that various modifications and another equivalent example may be made without departing from the scope and spirit of the present disclosure. Therefore, the sole technical protection scope of the present invention will be defined by the technical spirit of the accompanying claims.

What is claimed is:

1. A semiconductor memory device, comprising:
a pipe channel layer formed on a semiconductor substrate;
a first channel layer, a second channel layer and a third channel layer, connected with the pipe channel layer;
first conductive layers stacked while surrounding the first channel layer;
second conductive layers stacked while surrounding the second channel layer; and
third conductive layers stacked while surrounding the third channel layer,
wherein the first channel layer and the third channel layer are disposed at both sides of the second channel layer,
wherein each of the first channel layer and the third channel layer connects the pipe channel layer and a bit line layer, and
wherein the second channel layer connects the pipe channel layer and a source line layer.

2. The semiconductor memory device of claim 1, wherein the first channel layer and the third channel layer are a first drain side channel layer and a second drain side channel layer, respectively, and the second channel layer is a source side channel layer.

3. The semiconductor memory device of claim 2, further comprising:
a first drain side selection transistor line layer formed at a connection portion of the first drain side channel layer and the pipe channel layer, while surrounding the first drain side channel layer;
a second drain side selection transistor line layer formed at a connection portion of the second drain side channel layer and the pipe channel layer, while surrounding the second drain side channel layer; and
a source side selection transistor line layer formed at a connection portion of the source side channel layer and the pipe channel layer, while surrounding the source side channel layer.

4. The semiconductor memory device of claim 2, further comprising:
a first drain selection line layer formed at a connection portion of the first drain side channel layer and the bit line layer, while surrounding the first drain side channel layer;
a second drain selection line layer formed at a connection portion of the second drain side channel layers and a bit line, while surrounding the second drain side channel layer; and a source selection line layer formed at a connection portion of the source side channel layer and the source line layer, while surrounding the source side channel layer.

5. The semiconductor memory device of claim 3, wherein when a program target cell is a memory cell connected with the first drain side channel layer during a program operation, a power voltage is applied to the first drain side selection transistor line layer and the source side selection transistor line layer, and when the program target cell is a memory cell connected with the second drain side channel layer during the program operation, the power voltage is applied to the second drain side selection transistor line layer and the source side selection transistor line layer.

6. The semiconductor memory device of claim 3, wherein when a program target cell is a memory cell connected with the source side channel layer during a program operation, a power voltage is applied to one of the first drain side selection transistor line layer and the second drain side selection transistor line layer, and the source side selection transistor line layer, in order to connect one of the first drain side channel layer and the second drain side channel layer with the pipe channel layer and the source side channel layer.

7. The semiconductor memory device of claim 2, wherein the first- and second drain side channel layers are vertically connected to the pipe channel layer at both sides of the pipe channel layer, and the source side channel layer is vertically connected to a center portion of the pipe channel layer.

8. A semiconductor memory device, comprising:
a pipe channel layer formed on a semiconductor substrate;
a first drain side channel layer connecting the pipe channel layer and a bit line layer;
a second drain side channel layer connecting the pipe channel layer and the bit line layer; and
a source side channel layer connecting the pipe channel layer and a source line layer, and disposed between the first drain side channel layer and the second drain side channel layer.

9. The semiconductor memory device of claim 8, further comprising:
a first drain side selection transistor line layer formed at a connection portion of the first drain side channel layer and the pipe channel layer, while surrounding the first drain side channel layer;
a second drain side selection transistor line layer formed at a connection portion of the second drain side channel layer and the pipe channel layer, while surrounding the second drain side channel layer; and
a source side selection transistor line layer formed at a connection portion of the source side channel layer and the pipe channel layer, while surrounding the source side channel layer.

10. The semiconductor memory device of claim 9, further comprising:
a first drain selection line layer formed at a connection portion of the first drain side channel layer and the bit line layer, while surrounding the first drain side channel layer;
a second drain selection line layer formed at a connection portion of the second drain side channel layers and a bit line, while surrounding the second drain side channel layer: and
a source selection line layer formed at a connection portion of the source side channel layer and the source line layer, while surrounding the source side channel layer.

11. The semiconductor memory device of claim 9, wherein when a program target cell is a memory cell connected with the first drain side channel layer during a program operation, a power voltage is applied to the first drain side selection transistor line layer and the source side selection transistor line layer, and a ground voltage is applied to the second drain side selection transistor line layer.

12. The semiconductor memory device of claim 10, wherein when a program target cell is a memory cell connected with the source side channel layer during a program operation, a power voltage is applied to one of the first drain side selection transistor line layer and the second drain side selection transistor line layer, and the source side selection transistor line layer, in order to connect one of the first drain side channel layer and the second drain side channel layer with the pipe channel layer and the source side channel layer.

13. A semiconductor memory device, comprising:
a source side channel layer including a source selection transistor, source side memory cells, and a source side selection transistor, which are serially connected between a source line layer and a common node;
a first drain side channel layer including a first drain selection transistor, first drain side memory cells, and a first drain side selection transistor, which are serially connected between a bit line layer and the common node; and
a second drain side channel layer including a second drain selection transistor, second drain side memory cells, and a second drain side selection transistor, which are serially connected between the bit line layer and the common node,
wherein the first drain side channel layer and the second drain side channel layer are connected in parallel between the bit line layer and the common node.

14. The semiconductor memory device of claim 13, wherein when a program target cell is one of the first drain side memory cells during a program operation, the first drain side selection transistor is turned on.

15. The semiconductor memory device of claim 13, wherein when a program target cell is one of the first drain side memory cells during a program operation, the second drain side selection transistor is turned off.

16. The semiconductor memory device of claim 13, wherein when a program target cell is one of the first drain side memory cells during a program operation, the source side selection transistor is turned on.

17. The semiconductor memory device of claim 13, wherein when a program target cell is one of the source side memory cells during a program operation, the first drain side selection transistor and the source side selection transistor are turned on.

18. The semiconductor memory device of claim 13, wherein when a program target cell is one of the source side memory cells during a program operation, the second drain side selection transistor is turned off.

19. The semiconductor memory device of claim 13, wherein the common node is disposed at a pipe channel layer that is horizontally disposed to a semiconductor substrate, and wherein the first side channel layer and the second drain side channel layer are vertically connected to the pipe channel layer at both sides of the pipe channel layer, and the source side channel layer is vertically connected to a center portion of the pipe channel layer.

* * * * *